(12) United States Patent
Duvillaret et al.

(10) Patent No.: US 7,769,250 B2
(45) Date of Patent: Aug. 3, 2010

(54) ELECTROOPTIC PROBE FOR MEASURING TEMPERATURE AND ELECTROMAGNETIC FIELD

(75) Inventors: Lionel Duvillaret, Chambery (FR); Gwenaël Gaborit, Chambery (FR)

(73) Assignees: Institut National Polytechnique de Grenoble, Grenoble (FR); Universite de Savoie, Chambery (FR)

( * ) Notice: Subject to any disclaimer, the term of this patent is extended or adjusted under 35 U.S.C. 154(b) by 0 days.

(21) Appl. No.: 12/305,068

(22) PCT Filed: Jun. 15, 2007

(86) PCT No.: PCT/FR2007/051444

§ 371 (c)(1),
(2), (4) Date: Mar. 19, 2009

(87) PCT Pub. No.: WO2007/144546

PCT Pub. Date: Dec. 21, 2007

(65) Prior Publication Data

US 2009/0274410 A1    Nov. 5, 2009

(30) Foreign Application Priority Data

Jun. 16, 2006    (FR) .................................. 06 52156

(51) Int. Cl.
*G02B 6/00* (2006.01)

(52) U.S. Cl. .............................. 385/11; 385/15; 385/24

(58) Field of Classification Search ........................ None
See application file for complete search history.

(56) References Cited

U.S. PATENT DOCUMENTS 4,215,576 A * 8/1980 Quick et al. ................. 374/161

6,680,798 B2 * 1/2004 Kreuzer ....................... 359/499
6,906,506 B1    6/2005 Reano et al.

FOREIGN PATENT DOCUMENTS

| CA | 2148310 A1 | 11/1995 |
| EP | 0682261 A2 | 11/1995 |
| FR | 2751409 A1 | 1/1998 |
| JP | 2003004776 A | 1/2003 |
| JP | 2005214892 A | 8/2005 |

OTHER PUBLICATIONS

Filippov, V.N. et al., "Fiber Sensor for Simultaneous Measurement of Voltage and Temperature", IEEE Photonics Technology Letters, IEEE Service Center, Piscataway, NJ, US, vol. 12, No. 11, Nov. 2000. pp. 1543-1545.
International Search Report dated Nov. 27, 2007.

* cited by examiner

*Primary Examiner*—Charlie Peng
*Assistant Examiner*—Eric Wong
(74) *Attorney, Agent, or Firm*—Howard IP Law Group, PC

(57) ABSTRACT

A device for measuring an electromagnetic field and the temperature in an analysis zone includes a light source for sending a light beam into a polarization-maintaining optical fiber. The light beam is directed along one axis of the fiber. An anisotropic electrooptic material is placed in the zone for receiving the beam from optical fiber and for sending the beam into the fiber. The device further includes an arrangement for analyzing the intensity of the linear wave and a mechanism for determining the variations in the orientation of the linear wave output by phase-shifting means. A quarter-wave plate is inserted between the optical fiber and the crystal, wherein the plate has its axes oriented at substantially 45° to the axes of the optical fiber.

12 Claims, 1 Drawing Sheet

ELECTROOPTIC PROBE FOR MEASURING TEMPERATURE AND ELECTROMAGNETIC FIELD

FIELD

This application is the national stage application under 35 U.S.C. §371 of International Application No. PCT/FR2007/051444 and claims the benefit of Int'l. Application No. PCT/FR2007/051444, filed Jun. 15, 2007 and French Application No. 06/52156, filed Jun. 16, 2006, the entire disclosures of which are incorporated herein by reference in their entireties.

1. Field of the Invention

The present invention relates to the measurement of electromagnetic fields in analysis areas of small dimensions.

In the present application, the term "electromagnetic field" or simply "field" will designate a true electromagnetic field or a purely magnetic field, or a purely electric field.

2. Discussion of Prior Art

One of the difficulties when measuring an electromagnetic field is that this field is likely to directly react on the circuits of the measurement instruments used to measure it or to be influenced by said instruments. To avoid this disadvantage, optical detection systems have been provided, in which the field reacts on a light beam crossing an electro-optical crystal. In an electro-optical crystal, the field essentially acts on the polarization of a light beam. Optical waves with a rectilinear polarization, with a circular polarization, and with an elliptical polarization will here be mentioned. To avoid burdening the present description, it will be spoken, as often done in current practice, of rectilinear, circular, or elliptical waves, and it should be understood that these waves are, each time, optical waves having a respectively rectilinear, circular, or elliptical polarization.

An example of a conventional electromagnetic field optical measurement device is illustrated in FIG. 1. The detector is formed of an electro-optical crystal 1 having an end 2 comprising a reflecting surface and having its other end coupled by a coupler 3 to one end of a polarization-maintaining optical fiber 5. Polarized light is sent by a source of polarized light, coherent or not, for example comprising a light-emitting diode 7 and a polarizer 8, to the other end of optical fiber 5 via a coupler 9.

The light reflected by mirror 2 and thus having crossed crystal 1 twice and fiber 5 twice is collected by a beam splitter 11 and sent into a polarization analysis assembly, for example comprising a quarter-wave plate (or λ/4 plate) 13, a half-wave plate (or λ/2 plate) 14 and a polarizer 15, each of these elements being individually settable to rotate, either manually or under the effect of a control device 17. It should be noted that, usually, in the field of anisotropic optics, "polarizer" will be used to designate an element likely to set the polarization of the light crossing it towards a device using this light, and "analyzer" will be used to designate this same device when it is placed on the side of the detector of a system, and is used for the analysis of the polarization of the light that it receives. In the present description, term "polarizer" will always be used, be it placed in a position where it sets the polarization or in a position where it analyzes the polarization of the light that it receives, given that it effectively is the same hardware device. Term "analyzer" will be reserved to an assembly of analysis of the polarization state of a light wave, comprising the assembly of λ/4 plate 13, of λ/2 plate 14, and of polarizer 15.

At the output of polarizer 15 is arranged a photodetector 19 which provides on a terminal 20 a signal proportional to the intensity of the wave incident on polarizer 15 in the polarization direction of this polarizer. It should be understood by those skilled in the art that, in the absence of a field at the level of sensor 1, optical fiber 5 will transmit to crystal 1 a wave with a rectilinear polarization along the direction of an axis of the polarization-maintaining fiber (if polarizer 8 is aligned along one of the two axes of fiber 5). This polarization state will be modified by the anisotropic crystal which will send an elliptical wave back into the fiber. Analyzer 13-15 is set in the absence of a field to set a reference point. Then, when a field is applied on crystal 1, this modifies the crystal indexes and the polarization of the wave received at the level of analyzer 13-15 changes. This modification is characteristic of the field applied at the level of the sensor and may be detected by analyzer 13-15.

It should be reminded that only one component of the field, parallel to a sensitivity vector characteristic of the used electro-optical crystal, is measured by this type of device.

Various means have been suggested to optimize the measurement. For example, it will be preferred for the axes of electro-optical crystal 2 form a 45° angle with the axes of the polarization-maintaining fiber.

A device of the type described hereinabove a priori provides good results, especially due to the fact that it enables for the elements requiring the presence of electric currents, comprising light source 7, photoreceptor 19, and the circuits not shown for analyzing its output signal 20 to be distant from the area where the field is measured. Thus, these elements are not disturbed by the field to be measured, no more than they disturb this field. It can however be observed that the setting of the device, and especially the setting of the above-mentioned reference point, considerably drifts along time, especially when the optical fiber is too long. It can have been noted that this drifting is especially linked to temperature fluctuations. Thus, a same field risks being measured as having different values if the temperature has varied without it being noticed. A readjustment of the setting of the reference point of analyzer 13-15 must thus be performed very often to obtain a reliable reference, and this empirical setting is relatively long and difficult.

SUMMARY OF THE INVENTION

The present invention aims at overcoming at least some of the disadvantages of optical field measurement devices.

The present invention further aims at providing an analysis system which is particularly simple to use.

The present invention also aims at providing not only the value of the intensity of the field at the level of the analysis area, but also the temperature at the level of this analysis area.

To achieve all or part of these and other objects, the present invention provides a device for measuring an electromagnetic field and the temperature in an analysis area, comprising a light source sending into a polarization-maintaining optical fiber a light beam polarized along an axis of the fiber; an anisotropic electro-optical material arranged in said area, receiving the beam from the optical fiber and sending back a beam into this fiber; means for shifting the phase of the beam sent back into the fiber transforming the elliptical incident wave into a rectilinear wave; means for analyzing the intensity of said rectilinear wave; a λ/4 plate inserted between the optical fiber and the crystal, having its axes oriented at 45 degrees with respect to the axes of the optical fiber, and means for determining the variations of the orientation of said rectilinear wave at the output of the phase-shift means.

According to an embodiment of the present invention, the optical phase-shift means comprise a Soleil-Babinet compensator.

A method for setting the device comprises the steps of:
  setting the orientation of said phase-shift means to obtain a rectilinear wave at its output;
  detecting the orientation of said rectilinear wave; and
  readjusting the setting of the phase-shift means if the signal is out of adjustment after a temperature variation of the fiber.

BRIEF DESCRIPTION OF THE DRAWINGS

The foregoing objects, features, and advantages of the present invention, as well as others, will be discussed in detail in the following non-limiting description of specific embodiments in connection with the accompanying drawings, among which.

DETAILED DESCRIPTION

Figure 1:
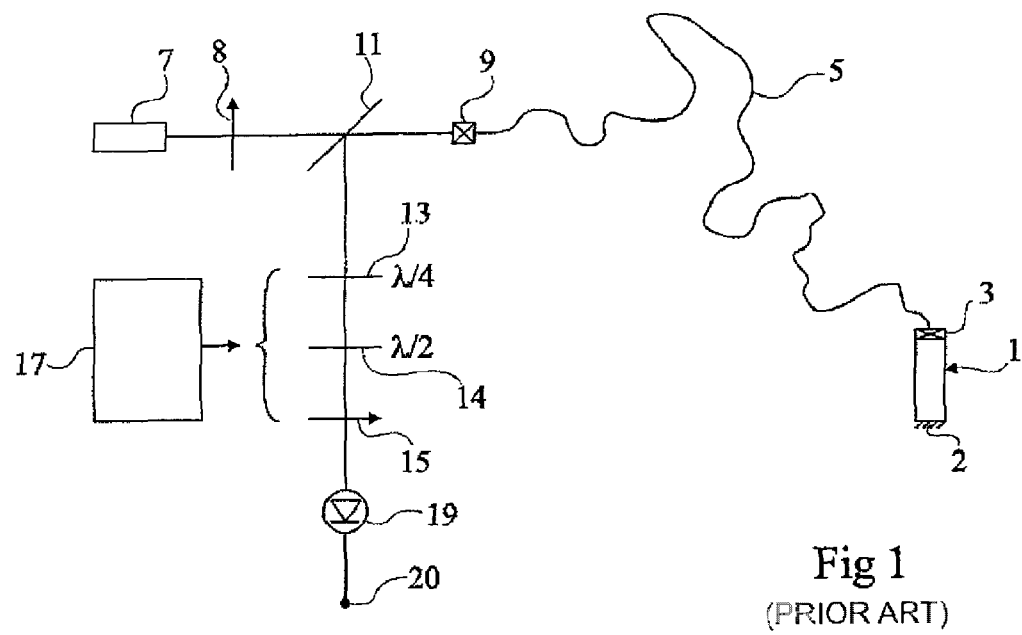
FIG. 1 schematically shows a device for measuring an electromagnetic field with an electro-optical effect crystal according to prior art.
Figure 2:
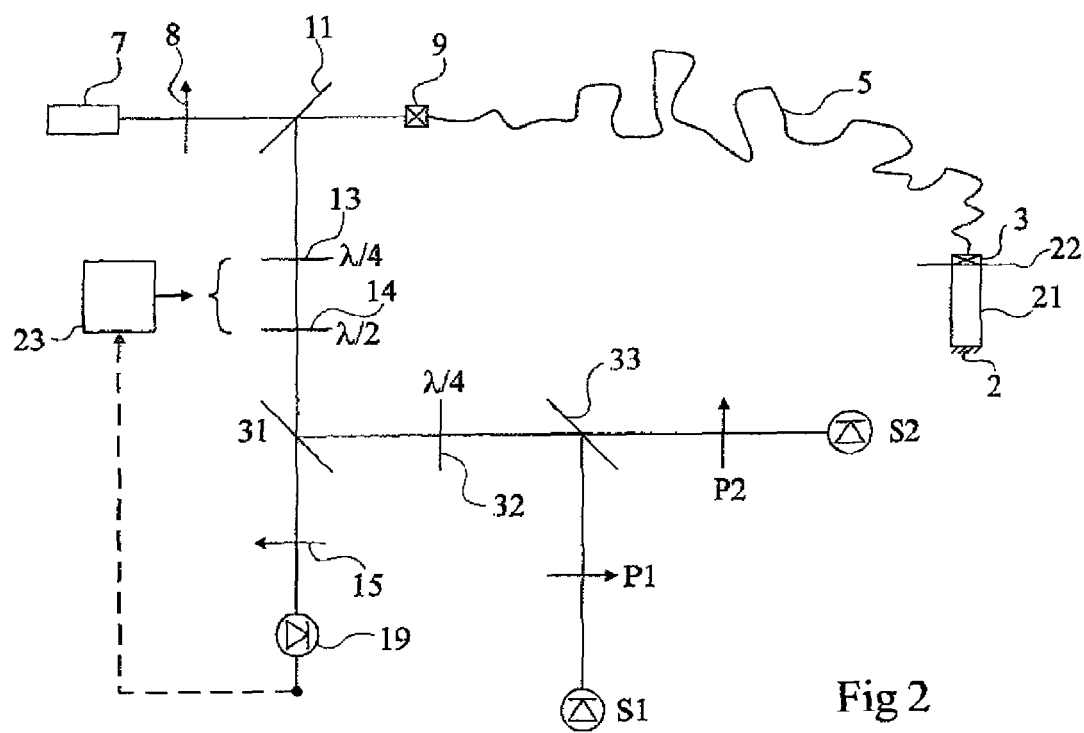
FIG. 2 schematically shows an embodiment of a device for measuring an electromagnetic field with an electro-optical effect crystal according to the present invention.

The present invention, having an embodiment illustrated in FIG. 2, uses a hardware device similar to that shown in FIG. 1 and the same elements thereof will be designated with same reference numerals and will not be described again. The present invention essentially differs from prior art by the mode in which the hardware elements of the device are used. It especially provides a device 23 for setting phase-shift elements 13-14 clearly separate from a device 25 for setting the polarizer, this last device further comprising means for measuring the position of the polarizer, which is symbolized by the double arrow between block 25 and polarizer 15. Further, the present invention provides placing between the crystal and the fiber a λ/4 plate 22 oriented at 45° with respect to the fiber axes. Then, the polarization sent into the crystal will be a circular polarization and the crystal axes may be placed at any angle with respect to the fiber axes and to the quarter-wave plate. It should be noted that it is often easier to set the orientation of a quarter-wave plate with respect to a fiber than the orientation of a crystal with respect to this fiber, a crystal being always delicate to handle.

In the following, the following notations will be used:

θ: phase shift introduced by polarization-maintaining fiber 5 between the polarizations aligned along its specific dielectric axes (this phase shift varies along with the fiber temperature), Δϕ: phase shift introduced by the polarizations oriented according to the dielectric axes of the crystal by a return travel in the material of the electro-optical crystal, with $\Delta\phi = \phi_0 + \phi_E$, $\phi_0$ being the phase shift linked to the crystal anisotropy and $\phi_E$ being the phase shift linked to the presence of a field, further noting that $\phi_E$ is always very small as compared to $2\pi$, α: any fixed angle between the crystal axes and the axes of polarization-maintaining fiber 5, γ: phase shift introduced by the phase shifter corresponding to the assembly of λ/4 and λ/2 plates 13 and 14, and ψ: orientation of polarizer 15.

The inventors have in particular calculated relations between the above-defined angles for the case where the following states are imposed to the device polarizations:
  polarizer 8 oriented along an axis of polarization-maintaining fiber 5;
  phase-shifter 13, 14 set to output a rectilinear wave;
  polarizer 15 set (preferably) to output a signal having 50% of the intensity that it would have in the absence of this polarizer.

Then, the inventors have shown that:

$$\gamma = \pi/2 - (2\alpha + \theta),$$

and that, in the absence of a field:

$$\psi = \pi/4 + \phi_0/2.$$

Thus, the setting of the phase-shifter system only depends on θ, that is, on the fiber parameters, while the orientation of the polarizer only depends on $\phi_0$, that is, on the crystal parameters.

In other words, if the field on the detector is constant (possibly null) and the fiber temperature varies, the same rectilinear polarization orientation will be found by adjusting the setting of phase-shifter 13-14.

However, if the crystal temperature varies, a rectilinear polarization having an orientation different from the preceding orientation will be obtained by adjusting the setting of the phase-shifter and the variation of the angle of polarizer 15 will indicate the temperature variation.

With such settings, the output signal of the photodetector will be equal to $(1+\sin\phi_E)/2$ in the case where polarizer 15 has been set so that the output light intensity is half of what it would be in the absence of this polarizer.

As a summary, in the above conditions:
  the angular variation (measured or not) of the phase-shifter, at constant output polarization, is only characteristic of the fiber temperature variations,
  the orientation variations of the polarizer only depend on the temperature variations of the crystal, and
  the variations of the output signal of the photodetector only depend on the measured field.

An accurate device for measuring the field and the temperature at a point in space is thus obtained.

It should be noted that the measurement of the temperature variations associated with field variations may be particularly valuable in applications where the influence of a field on a living organism is desired to be determined.

Further, the present invention is likely to have many particularities or variations, among which the following can be mentioned without being limiting.

1. As known, to transform an elliptical wave into a rectilinear wave, instead of using a λ/4 plate or a λ/2 plate to analyze the received wave, any device known to enable to achieve this result may be used, for example, a Soleil-Babinet compensator. This compensator may be automatically controlled by a signal originating from photodetector 19 via a control device 23. This control may be carried out in various ways, for example, by providing an initial polarizer rotating phase and/or by providing a polarization splitting system.

2. Automated means 25 for controlling the setting of the angle of polarizer 15 and measure its orientation, various devices for obtaining this result being known in the art.

3. To perform the settings, it may be provided for the polarizer to be set in certain cases in a rotating polarization state to properly detect whether the wave incident on polarizer 15 has a rectilinear polarization.

4. If the field applied to sensor 1 is an alternating field of given frequency, a synchronous detection of output signal 20 of photodetector 19 will preferably be performed to collect an indication of the field value along the sensitive axis of the detector.

5. The electro-optical crystal is an anisotropic crystal, sensitive to the Pockels effect, for example, lithium tantalate.

6. To increase the sensitivity, elements forming an antenna may be associated with the sensor crystal.

7. Various provisions may be adopted to analyze the rectilinear character of the wave coming out of phase shifter 13-14, for example, systems using polarization splitters.

Of course, the present invention is likely to have all other variations and modifications which will occur to those skilled in the art.

The invention claimed is:

1. A device for measuring an electromagnetic field and the temperature in an analysis area, comprising:
    a light source for sending into a polarization-maintaining optical fiber a light beam polarized along an axis of the fiber;
    an anisotropic electro-optical material arranged in said area, for receiving the beam from the optical fiber and sending back the beam into the fiber;
    optical controlled means for shifting the phase of the beam sent back into the fiber thereby transforming an elliptical incident wave into a rectilinear wave;
    means for analyzing the intensity of said rectilinear wave;
    a quarter-wave plate, inserted between the optical fiber and said anisotropic electro-optical material, having its axes oriented at substantially 45 degrees with respect to the axes of the optical fiber, and
    means for determining the variations of an orientation of said rectilinear wave at the output of the phase-shift means.

2. The device of claim 1, wherein the optical controlled phase-shift means comprise a Soleil-Babinet compensator.

3. A method for using a device, for measuring an electromagnetic field and the temperature in an analysis area said device comprising:
    a light source for sending into a polarization-maintaining optical fiber a light beam polarized along an axis of the fiber;
    an anisotropic electro-optical material arranged in said area, for receiving the beam from the optical fiber and sending back the beam into the fiber;
    controlled phase-shift elements for shifting the phase of the beam sent back into the fiber thereby transforming an elliptical incident wave into a rectilinear wave;
    a photodetector for analyzing the intensity of said rectilinear wave;
    a quarter-wave plate, inserted between the optical fiber and said anisotropic electro-optical material, having its axes oriented at substantially 45 degrees with respect to the axes of the optical fiber, and
    means for determining the variations of an orientation of said rectilinear wave at the output of the controlled phase-shift elements, wherein said method comprises the steps of:
        setting the orientation of said controlled phase-shift elements to obtain a rectilinear wave at its output;
        detecting the orientation of said rectilinear wave; and
        readjusting the setting of the controlled phase-shift elements when the orientation of said rectilinear wave varies after a temperature variation of the fiber.

4. The method of claim 3, wherein a control device controls setting the phase shift of said controlled phase-shift elements.

5. The method of claim 4, wherein the means for determining the variations of an orientation of said rectilinear wave at the output of the controlled phase-shift elements includes a polarizer downstream of said controlled phase shift elements, and a device for measuring and setting the position of said polarizer.

6. The method of claim 5, wherein said control device for setting said controlled phase-shift elements and said device for measuring and setting the position of said polarizer are separate devices.

7. A device for measuring an electromagnetic field and the temperature in an analysis area, comprising:
    a light source for sending into a polarization-maintaining optical fiber a light beam polarized along an axis of the fiber;
    an anisotropic electro-optical material arranged in said area, for receiving the beam from the optical fiber and sending back the beam into the fiber;
    a quarter-wave plate, inserted between the optical fiber and said anisotropic electro-optical material, having its axes oriented at substantially 45 degrees with respect to the axes of the optical fiber;
    controlled phase-shift elements for shifting the phase of the beam sent back into the fiber thereby transforming an elliptical incident wave into a rectilinear wave;
    a photodetector for analyzing the intensity of said rectilinear wave;
    a polarizer, operatively coupled to a device for measuring and setting the position of said polarizer; and
    a control device for setting said controlled phase-shift elements.

8. The device of claim 7, wherein said device for measuring and setting the position of said polarizer and said control device for setting said controlled phase-shift elements are separate devices.

9. The device of claim 8, wherein said device for measuring and setting the position of said polarizer automatically measures the orientation and sets the angle of the polarizer.

10. The device of claim 1, wherein said anisotropic electro-optical material comprises an electro-optical effect crystal.

11. The method of claim 3, wherein said anisotropic electro-optical material comprises an electro-optical effect crystal.

12. The device of claim 7, wherein said anisotropic electro-optical material comprises an electro-optical effect crystal.

* * * * *